(12) United States Patent
Murakami et al.

(10) Patent No.: US 12,491,679 B2
(45) Date of Patent: Dec. 9, 2025

(54) IMPRINT DEVICE, IMPRINT METHOD, STORAGE MEDIUM, AND ARTICLE MANUFACTURING METHOD

(71) Applicant: CANON KABUSHIKI KAISHA, Tokyo (JP)

(72) Inventors: Yosuke Murakami, Tochigi (JP); Kazuki Nakagawa, Tochigi (JP); Masahiro Tamura, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 366 days.

(21) Appl. No.: 17/735,238

(22) Filed: May 3, 2022

(65) Prior Publication Data

US 2022/0388230 A1    Dec. 8, 2022

(30) Foreign Application Priority Data

Jun. 7, 2021   (JP) .................................. 2021-095416

(51) Int. Cl.
*B29C 59/02*    (2006.01)
*B29C 37/00*    (2006.01)
(Continued)

(52) U.S. Cl.
CPC ............ *B29C 59/02* (2013.01); *B29C 59/002* (2013.01); *G03F 7/0002* (2013.01)

(58) Field of Classification Search
CPC ...... B29C 59/02; B29C 59/002; G03F 7/0002
See application file for complete search history.

(56) References Cited

U.S. PATENT DOCUMENTS

2005/0072755 A1    4/2005   McMackin et al.
2015/0042012 A1*   2/2015   Nakagawa ............ B29C 59/026
                                                     264/293
(Continued)

FOREIGN PATENT DOCUMENTS

JP    2017199731 A  * 11/2017
JP    2018195639 A    12/2018
(Continued)

OTHER PUBLICATIONS

Office Action issued in Korean Appln. No. 10-2022-0065138 mailed Dec. 10, 2024. English translation provided.

*Primary Examiner* — Jerzi H Moreno Hernandez
(74) *Attorney, Agent, or Firm* — ROSSI, KIMMS & McDOWELL LLP (57) ABSTRACT

In order to provide an imprint device and the like that can efficiently maintain a concentration of a gas when imprinting is sequentially performed, the imprint device includes: a mold holding unit configured to a mold; a substrate holding unit configured to holding a substrate; a gas supply unit configured to supply a gas to an imprint space between the mold and the substrate; and a control unit configured to control the gas supply unit and an imprinting operation, wherein the control unit is configured to sequentially perform imprinting on a plurality of imprint regions of the substrate, and the control unit is configured to, when a moving direction of the substrate between the imprint regions is changed from a first direction to a second direction, supply a gas to the imprint space in the first direction and the second direction using the gas supply unit during the imprinting operation on the imprint region before the change in the moving direction.

4 Claims, 10 Drawing Sheets

(51) Int. Cl.
  *B29C 59/00*   (2006.01)
  *G03F 7/00*    (2006.01)

(56)                References Cited

U.S. PATENT DOCUMENTS

2015/0352776 A1*  12/2015  Ogasawara ........... G03F 7/0002
                                                        264/293
2016/0327857 A1*  11/2016  Kimura ................. G03F 7/0002
2019/0263031 A1*   8/2019  Murasato ................ B29C 59/02
2019/0317398 A1*  10/2019  Murakami ............. G03F 7/002
2023/0305388 A1*   9/2023  Kobayashi ............ G03F 7/0002

FOREIGN PATENT DOCUMENTS

JP       2019091741 A     6/2019
KR     1020140116209 A   10/2014
KR     1020170030050 A    3/2017
KR     1020190073580 A    6/2019
KR     1020190120703 A   10/2019

\* cited by examiner

IMPRINT DEVICE, IMPRINT METHOD, STORAGE MEDIUM, AND ARTICLE MANUFACTURING METHOD

BACKGROUND OF THE INVENTION

Field of the Invention

The present invention relates to an imprint device, an imprint method, a storage medium, an article manufacturing method, and the like.

Description of the Related Art

Micronization of semiconductor devices has been required, and a fine processing technique of shaping (molding) an imprint material on a substrate using an original form (a mold) and curing the shaped imprint material to form a pattern on the substrate has attracted attention in addition to photolithography technology according to the related art. Such a technique is called an imprint technique and enables a fine pattern on the order of several nanometers to be formed on a substrate.

For example, a photo-curing method is known as one imprint technique. An imprint device employing the photo-curing method forms a pattern on a substrate by bringing a mold into contact with a photo-curable imprint material supplied to the imprint device (mold impressing), curing the imprint material by irradiation with light, and releasing the mold from the cured imprint material (mold releasing).

At the time of impression, air (residual gas) between the mold and the imprint material may be mixed as bubbles into the uncured imprint material and cause unfilled defects (pattern defects). Therefore, US Patent Application Publication No. 2005/0072755 discloses a technique of curbing staying of bubbles by saturating a space between a mold and a substrate with a gas which has high solubility, high diffusibility, or both properties in the imprint material (hereinafter simply referred to as a "gas"). Japanese Unexamined Patent Application Publication No. 2019-91741 discloses an imprint device that performs supply of a gas in a state in which a mold and an imprint material have come into contact and supplies a gas to a space between the mold and a substrate when the mold and the imprint material are separated from each other.

In such an imprint device, there is a likelihood that a concentration of a gas will decrease when imprinting is consecutively performed on a plurality of regions on a substrate. Accordingly, there is a likelihood that defects that will decrease productivity of the imprint device will occur.

Therefore, one of objectives of the present invention is to provide an imprint device and the like that can efficiently maintain a concentration of a gas when imprinting is sequentially performed.

SUMMARY OF THE INVENTION

According to one aspect of the present invention, there is provided an imprint device including a mold holding unit configured to holding a mold, a substrate holding unit configured to holding a substrate, at least one processor or circuit configured to function as: a gas supply unit configured to supply a gas to an imprint space between the mold and the substrate, and a control unit configured to control the gas supply unit and an imprinting operation, wherein the control unit is configured to sequentially perform imprinting on a plurality of imprint regions of the substrate, and the control unit is configured to, when a moving direction of the substrate between the imprint regions is changed from a first direction to a second direction, supply a gas to the imprint space in the first direction and the second direction using the gas supply unit during the imprinting operation on the imprint region before the change in the moving direction.

Further features of the present invention will become apparent from the following description of embodiments with reference to the attached drawings.

DESCRIPTION OF THE EMBODIMENTS

Hereinafter, with reference to the accompanying drawings, favorable modes of the present invention will be described using Embodiments. In each diagram, the same reference signs are applied to the same members or elements, and duplicate description will be omitted or simplified.

First Embodiment

In this specification and the accompanying drawings, directions in an XYZ coordinate system in which a direction parallel to a surface of a substrate is defined as an XY plane are described. Directions parallel to an X axis, a Y axis, and a Z axis in the XYZ coordinate system are defined as an X direction, a Y direction, and a Z direction, and rotation around the X axis, rotation around the Y axis, and rotation around the Z axis are defined as OX, OY, and OZ. Control or driving in the X axis, the Y axis, and the Z axis means control or driving in a direction parallel to the X axis, a direction parallel to the Y axis, and a direction parallel to the Z axis. Position determining means that a position, a posture, or a slope is controlled. Position aligning may include control of a position, a posture, or a slope of at least one of a substrate and a mold.

Figure 1A:
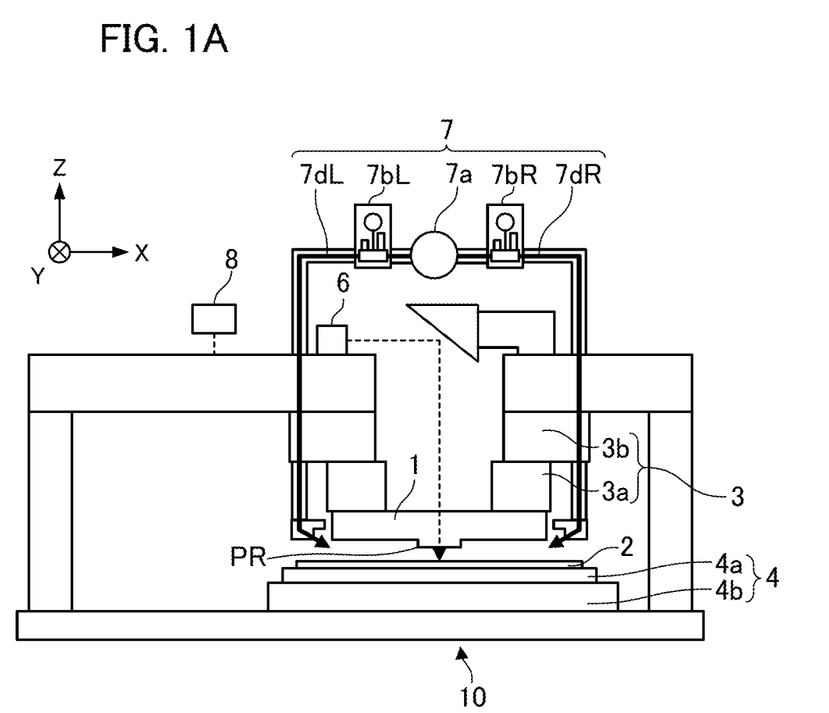
FIG. 1A is a diagram schematically illustrating a configuration of an imprint device 10 according to a first embodiment of the present invention and FIG. 1B is a bottom view of a mold.

FIG. 1A is a diagram schematically illustrating a configuration of an imprint device 10 according to a first embodiment of the present invention. The imprint device 10 is lithography equipment which is used for a process of manufacturing an article such as a semiconductor device. The imprint device 10 performs an imprinting process of bringing a pattern region of a mold into contact with an imprint material supplied onto a substrate (mold impressing), curing the imprint material by applying curing energy to the imprint material, and separating the mold from the imprint material (mold releasing). Accordingly, protruding/recessed patterns of a pattern region of the mold are transferred, and patterns of a cured material are formed on the substrate.

A curable composition (also referred to as an uncured resin) that is cured by applying curing energy thereto is used as the imprint material. Electromagnetic waves, heat, or the like is used as the curing energy. For example, light such as infrared light, visible light, or ultraviolet light which is selected from a range of wavelengths of 10 nm to 1 mm is used as the electromagnetic waves.

The curable composition is a composition which is cured by irradiation with light or by heating, A photo-curable composition which is cured by irradiation with light contains at least a polymerizable compound and a photopolymerization initiator and may further contain a non-polymerizable compound or a solvent according to necessity. The non-polymerizable compound is at least a type selected from a group consisting of a sensitizer, a hydrogen donor, an internally added mold releasing agent, a surfactant, an antioxidant, polymer components, and the like.

The imprint material may be applied in a film form on a substrate by a spin coater or a slit coater. The imprint material may be applied in a droplet form or an island or film form in which a plurality of droplets are connected on a substrate by a liquid spray head. The viscosity of the imprint material (viscosity at 25° C.) is, for example, equal to or greater than 1 mPa·s and equal to or less than 100 mPa·s.

The imprint device 10 includes, for example, a mold position determining unit 3 that holds a mold 1 and determines a position of the mold 1, a substrate position determining unit 4 that holds a substrate 2 and determines a position of the substrate 2, an irradiation unit 6, a gas supply unit 7, and a control unit 8.

Figure 1B:
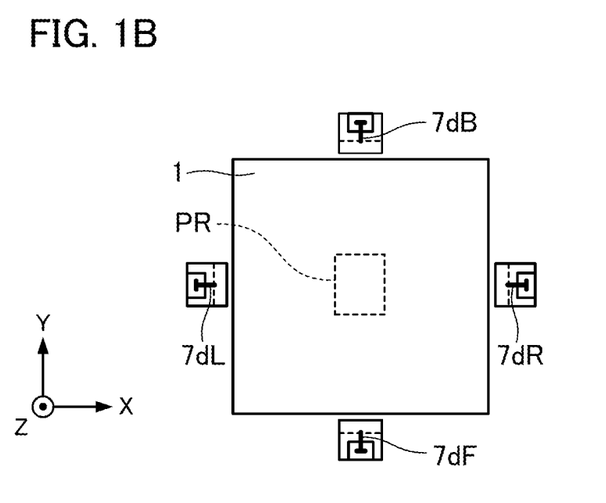

The mold 1 has, for example, a rectangular shape and is formed of a material that can transmit ultraviolet light such as quartz. The mold 1 includes a pattern region PR on a surface facing the substrate 2. Protruding/recessed patterns to be transferred to an imprint material on the substrate 2 are formed in a three-dimensional shape in the pattern region PR. The pattern region PR is also referred to as a mesa and is formed on a protruding portion of several tens of un to several hundred μm such that a part of the mold 1 other than the pattern region PR is not in contact with the substrate 2.

The substrate 2 is formed of, for example, a semiconductor (for example, silicon or a compound semiconductor), glass, a ceramic, a metal, or a resin. The substrate 2 may include one or more layers on a base. In this case, the base is formed of, for example, a semiconductor, glass, a ceramic, a metal, or a resin. An adhesive layer for improving adhesiveness between the imprint material and the substrate 2 may be provided on the substrate 2 according to necessity. A plurality of imprint regions are formed on the substrate 2.

The mold position determining unit 3 includes a mold holding unit 3a and a mold driving mechanism 3b. The mold holding unit 3a holds the mold 1, for example, using a vacuum suction force or an electrostatic force. The mold driving mechanism 3b is a driving system for changing a distance between the mold 1 and the substrate 2. The mold driving mechanism 3b drives (moves) the mold 1 in the Z-axis direction by driving the mold holding unit 3a. The mold driving mechanism 3b includes an actuator such as a linear motor or an air cylinder and drives the mold holding unit 3a holding the mold 1.

The mold driving mechanism 3b is configured to drive the mold 1 (the mold holding unit 3a), for example, with respect to a plurality of axes (for example, three axes including the Z axis, the OX axis, and the OY axis). In order to realize highly precise position determining of the mold 1, the mold driving mechanism 3b may include a plurality of driving systems such as a coarse driving system and a fine driving system. The mold driving mechanism 3b may have a function of driving the mold 1 in the X-axis direction, the Y-axis direction, and the OZ direction in addition to the Z-axis direction or a function of correcting the slope of the mold 1.

The substrate position determining unit 4 includes a substrate holding unit 4a holding the substrate 2 and a substrate driving mechanism 4b. The substrate holding unit 4a holds the substrate 2, for example, using a vacuum suction force or an electrostatic force. The substrate driving mechanism 4b drives (moves) the substrate 2 in the X-axis direction and the Y-axis direction by driving the substrate holding unit 4a. The substrate driving mechanism 4b includes an actuator such as a linear motor or an air cylinder and drives the substrate holding unit 4a holding the substrate 2.

The substrate driving mechanism 4b is configured to drive the substrate 2 (the substrate holding unit 4a) with respect to a plurality of axes (for example, three axes including the X axis, the Y axis, and the OZ axis, preferably, six axes including the X axis, the Y axis, the Z axis, the OX axis, the OY axis, and the OZ axis). The substrate driving mechanism 4b may include a plurality of driving systems such as a coarse driving system and a fine driving system. The substrate driving mechanism 4b may have a function of driving the substrate 2 in the Z-axis direction or the OZ direction (rotation around the Z axis) or a function of correcting the slope of the substrate 2.

The mold position determining unit 3 and the substrate position determining unit 4 are mechanisms that drive the mold 1 or the substrate 2 such that a relative position, a relative posture, and a relative slope in the XY plane of the mold 1 and the substrate 2 are adjusted and determines the relative position of the mold 1 and the substrate 2. The mold position determining unit 3 and the substrate position determining unit 4 can be used to perform alignment for reducing an error component in relative shift and rotation of the pattern region PR of the mold 1 and the imprint regions of the substrate 2. The mold position determining unit 3 and the substrate position determining unit 4 may detect alignment marks provided in the mold 1 and the substrate 2, for example, using an alignment measuring unit which is not illustrated and perform alignment.

The mold position determining unit 3 and the substrate position determining unit 4 are mechanisms that drive the mold 1 or the substrate 2 such that a distance d between the pattern region PR of the mold 1 and the imprint regions of the substrate 2 is changed and a relative position, a relative posture, and a relative slope in the Z direction of the mold 1 and the substrate 2 are adjusted. Adjustment of the relative position in the Z direction performed by the mold position determining unit 3 or the substrate position determining unit 4 includes contact (impression) of the pattern region PR of the mold 1 with the imprint material on the substrate 2. The adjustment also includes driving for separating (releasing) the pattern region PR of the mold 1 from the cured imprint material (a pattern of a cured material). The distance d may be detected, for example, by a laser interferometer or an encoder provided in the mold position determining unit 3 or the substrate position determining unit 4 and may be changed on the basis of the result of detection. The method of detecting the distance d is not limited thereto.

The irradiation unit 6 cures the imprint material by irradiating the imprint material with ultraviolet light or the like via the mold 1 which is transparent in a state in which the imprint material in the imprint region of the substrate 2 and the pattern region PR of the mold 1 are in contact. Accordingly, a pattern formed of a cured material of the imprint material is formed.

In the present embodiment, the irradiation unit 6 includes, for example, a light source that emits light for curing the imprint material (exposure light such as ultraviolet light).

The irradiation unit 6 may include an optical element such as an iris diaphragm for adjusting light emitted from the light source to light suitable for an imprinting process. In the present embodiment, since a photo-curing method is employed, a light source emitting ultraviolet light is used. For example, when a thermal cycling method is employed, a heat source for curing a thermosetting resin which is the imprint material may be used instead of the light source.

The gas supply unit 7 supplies a substituent gas to a space between the mold 1 and the substrate 2 and substitutes a gas in the space between the mold 1 and the substrate 2 with the substituent gas. When bubbles are included between the mold 1 and the imprint material at the time of curing the imprint material, locations of the bubbles may not be filled with the imprint material and defects may be generated in the pattern of the cured material. The gas supply unit 7 substitutes the gas in the space between the mold 1 and the imprint material with a permeable gas that is likely to permeate the mold 1 or the imprint material at the time of impression.

The gas in the space may be substituted with a condensable gas or the like that is condensed and liquefied with an increase in pressure when the mold 1 is brought into contact with the imprint material. For example, helium (He) gas is used as the permeable gas and, for example, pentafluoropropane (PFP) is used as the condensable gas. In the present embodiment, the substituent gas is a permeable gas, a condensable gas, or the like, and "gas" mentioned in the following description indicates the substituent gas.

The gas supply unit 7 includes a gas supply source 7$a$, gas control units 7$b$L, 7$b$R, 7$b$B (not illustrated), and 7$b$F (not illustrated), and gas supply paths 7$d$L, 7$d$R, 7$d$B, and 7$d$F. FIG. 1B is a bottom view of a mold and illustrates arrangement of the gas supply paths 7$d$L, 7$d$R, 7$d$B, and 7$d$F on the XY plane in the mold 1. As illustrated in FIG. 1B, a gas is supplied to a rectangular pattern region PR in directions substantially perpendicular to four sides of the pattern region PR.

The gas supply source 7$a$ is a supply source of the substituent gas and includes a tank which is filled with a gas. Alternatively, the gas supply source 7$a$ is connected to an external gas supply source. The gas control units 7$b$L, 7$b$R, 7$b$B (not illustrated), and 7$b$F (not illustrated) control a flow rate of a gas and are constituted by, for example, a mass flow controller (MFC). The gas supply paths 7$d$L, 7$d$R, 7$d$B, and 7$d$F are configured to emit a gas from a plurality of supply ports provided around the mold 1 held by the mold position determining unit 3.

The gas supply paths 7$d$L, 7$d$R, 7$d$B, and 7$d$F are connected to the gas control units 7$b$L, 7$b$R, 7$b$B, and 7$b$F and are configured to individually control the flow rates of a gas. The flow rate of the gas supplied from the gas supply source 7$a$ is controlled by the gas control units 7$b$L, 7$b$R 7$b$B, and 7$b$F as the gas passes through the gas supply paths 7$d$L, 7$d$R, 7$d$B, and 7$d$F and is discharged from the surroundings of the mold 1. Accordingly, the substituent gas is supplied to the space between the mold 1 and the substrate 2.

The control unit 8 controls the mold position determining unit 3, the substrate position determining unit 4, the irradiation unit 6, the gas supply unit 7, and the like and controls the imprint device 10 as a whole (in operations). The control unit 8 controls the constituents of the imprint device 10 such that an imprinting process is performed. The control unit 8 is constituted by, for example, a general-purpose computer and controls the whole imprint device by executing a computer program stored in a memory which is not illustrated. Alternatively, the control unit 8 is constituted by a programmable logic device (PLD) such as a field-programmable gate array (FPGA), an application-specific integrated circuit (ASIC), or the like or by a combination thereof.

Figure 2:
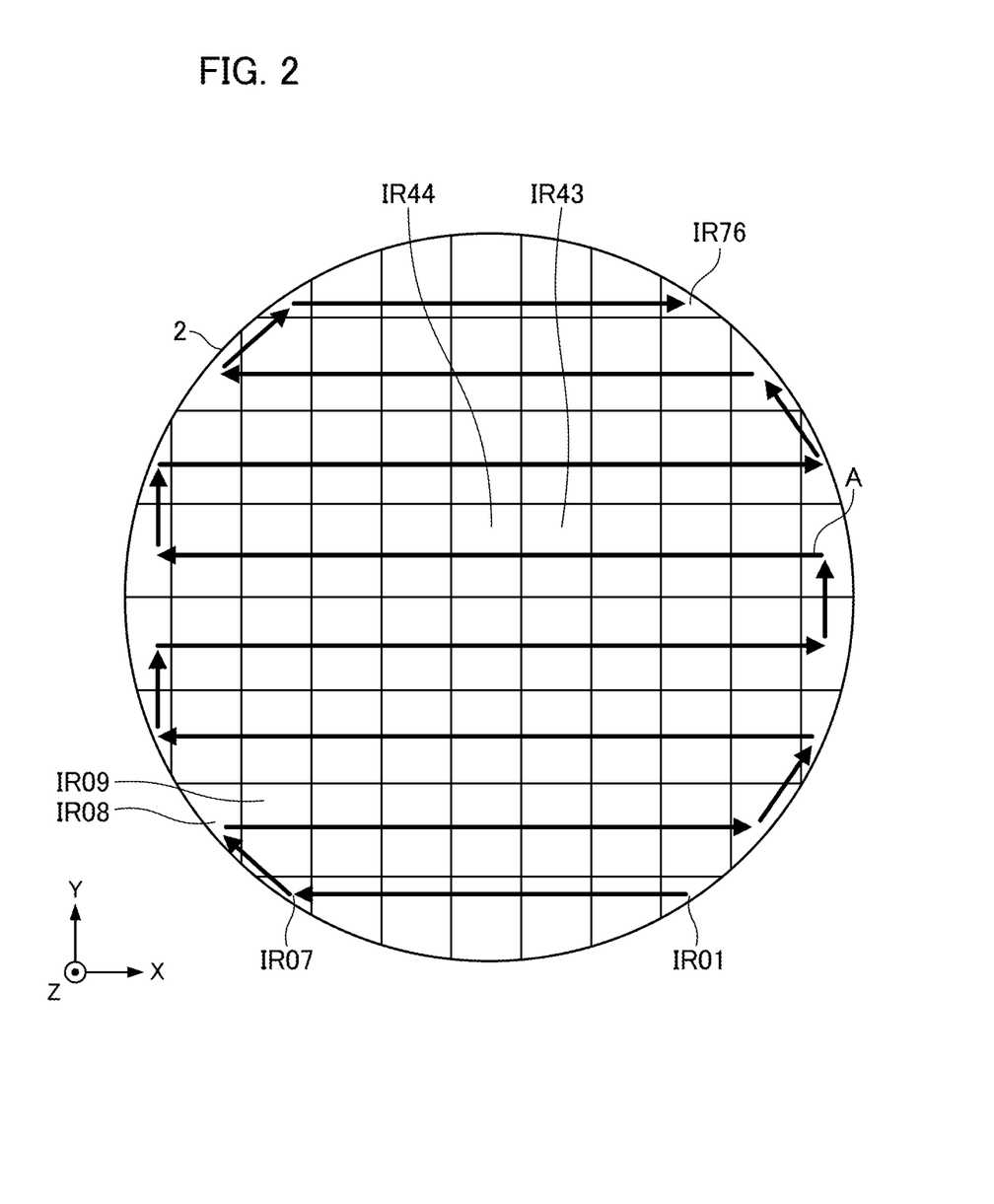
FIG. 2 is a top view of a substrate according to the first embodiment.

FIG. 2 is a top view of a substrate according to the first embodiment and illustrates an example of imprint regions and the imprinting order of the substrate 2.

Regions into which a circular substrate 2 is divided in a lattice shape are imprint regions. By performing an imprinting operation on each imprint region using the pattern region PR, patterns corresponding to a plurality of chips are simultaneously formed on the imprint material in the imprint regions.

Regarding the order in which the imprinting process is performed, an imprinting operation is sequentially performed in neighboring imprint regions such that a moving distance becomes shorter in general. For example, as illustrated in FIG. 2, the imprinting process is sequentially performed from an imprint region IR01 to an imprint region IR76 in the order of an arrow A. This imprinting order is an example and, for example, the imprinting operation may be performed in the opposite order such that the imprint region IR76 is a first imprint region and the imprint region IR01 is a final imprint region.

Figure 3:
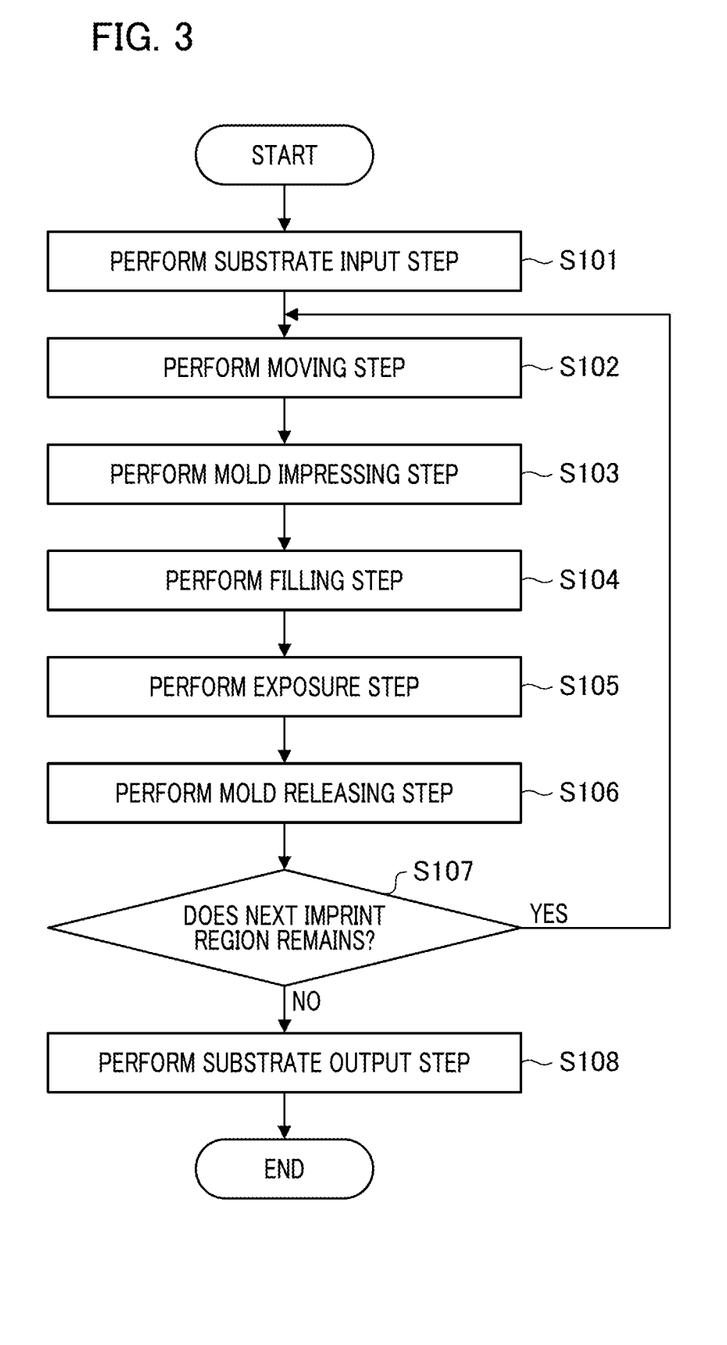
FIG. 3 is a flowchart illustrating an imprinting process which is performed by the imprint device 10 according to the first embodiment.

FIG. 3 is a flowchart illustrating the imprinting process which is performed by the imprint device 10 according to the first embodiment and illustrates a process of forming a pattern in a plurality of imprint regions of the substrate 2. The process illustrated in FIG. 3 is performed by causing the control unit 8 to execute a computer program stored in a memory which is not illustrated. Inputting of a mold 1 to the mold holding unit 3$a$ and outputting of the mold 1 from the mold holding unit 3$a$ will not be described.

In Step S101, a substrate 2 on which an imprinting process is to be performed is carried to the substrate holding unit 4$a$. In the present embodiment, it is assumed that the substrate 2 is carried to the imprint device 10 in a state in which an imprint material has been already applied thereon.

In Moving Step S102, the substrate position determining unit 4 is driven such that an imprint region on the substrate 2 on which the imprinting process is to be performed is located at a position just below the pattern region PR of the mold 1.

In Mold Impressing Step S103, the mold position determining unit 3 is driven and the pattern region PR of the mold 1 is impressed on the substrate 2.

In Step S104, a state in which the mold 1 and the substrate 2 are in contact with the imprint material interposed therebetween is maintained such that all parts of a pattern formed in the pattern region PR of the mold 1 are uniformly filled with the imprint material.

In Step S105, the imprint material is irradiated with light using the irradiation unit 6 and is cured.

In Mold Releasing Step S106, the mold position determining unit 3 is driven such that the mold 1 is separated from the substrate 2.

In Step S107, it is determined whether there is a next imprint region (an imprint region on which the imprinting process is to be performed in the next time). When there is a next imprint region, the process flow returns to Moving step S102 and the substrate 2 is moved such that the next imprint region is located at a position just below the pattern region PR of the mold 1. When there is no next imprint region, the process flow proceeds to Step S108.

In Step S108, the substrate 2 is carried from the substrate holding unit 4a, and the imprinting process ends.

Supply of a gas by the gas supply unit 7 will be described below with reference to FIGS. 4A to 5D. FIGS. 4A to 4D are schematic sectional views of the XZ plane illustrating operations of a mold 1, a substrate 2, and the gas supply paths 7dL and 7dR. FIGS. 5A to 5D are schematic diagrams of the XY plane illustrating a relationship between a mold, a substrate, and a distribution of a gas.

In FIGS. 4A to 4D and FIGS. 5A to 5D, an example of an imprinting operation performed on the imprint region IR43 to an imprinting operation performed on the imprint region IR44 in FIG. 2 will be described below.

Figure 4A:
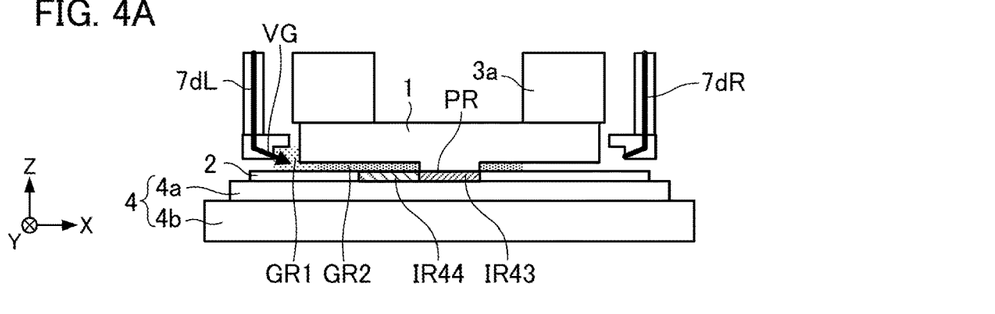
FIGS. 4A to 4D are schematic sectional views of an XZ plane illustrating operations of a mold 1, a substrate 2, and gas supply paths 7dL and 7dR.

FIG. 4A is a schematic sectional view for Step S104 which is a filling step. At this time, it is assumed that an imprinting operation is performed on the imprint region IR43. A region on which an imprinting operation is to be performed in the next time is the imprint region IR44. At this time, a gas is supplied from the gas supply path 7dL close to the imprint region IR44 on which an imprinting operation is to be performed in the next time (on the left side of FIG. 4A).

A flow direction of a gas is indicated by an arrow VG. A region to which the gas has been supplied is simply illustrated as a gas region GR1 in the drawing. The gas region GR2 represents a residual of the gas supplied when an imprinting process has been performed on the imprint region IR42 prior to the imprint region IR43. In FIG. 4A, a gas is additionally supplied to the gas region GR2 from the gas supply path 7dL and the imprinting process is performed.

Figure 5A:
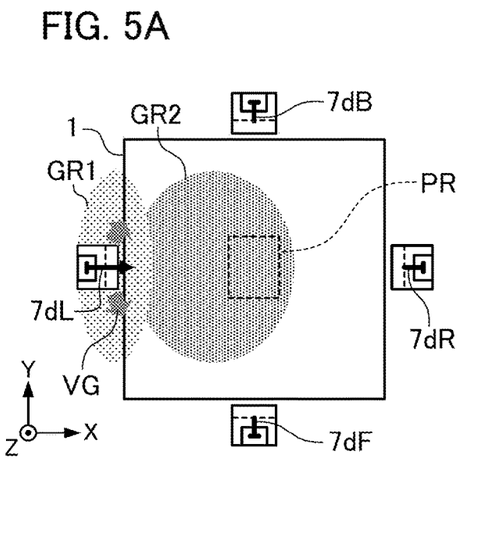
FIGS. 5A to 5D are schematic views of an XY plane illustrating a relationship between a mold, a substrate, and a distribution of a gas.

FIG. 5A is a schematic plan view of the XY plane illustrating a relationship between a mold, a substrate, and a distribution of a gas at the same timing as in FIG. 4A. In FIG. 5A, a gas region GR1 extends mainly in the direction parallel to the Y axis in a plan view of the XY plane. In a state in which the pattern region PR of the mold 1 and the substrate 2 are in contact with, the distance d between the mold 1 and the substrate 2 is several tens of μm and a gas hardly flows into a gap therebetween. Accordingly, the gas supplied from the gas supply path 7dL diffuses in a space of a side surface of the mold 1. At this time, the gas region GR2 is present around the pattern region PR. Actually, the gas diffuses into the air over time and the range of the gas region GR2 of which a concentration is equal to or greater than a predetermined concentration is gradually narrowed.

Figure 4B:
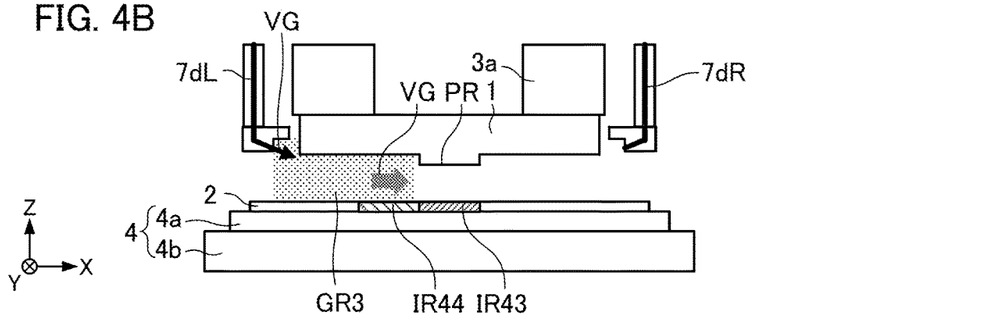

FIG. 4B is a schematic sectional view for Step S106 which is a mold releasing step. In this step, when the mold 1 and the substrate 2 are separated apart, a negative pressure is generated therebetween and thus a gas flows thereto from the surroundings. Since the gas is supplied from the gas supply path 7dL, the supplied gas flows to the center of the mold 1 in the area from the pattern region PR of the mold 1 to the gas supply path 7dL (on the left side of the drawing). In the other area, surrounding air flows to the pattern region PR (not illustrated). In FIG. 4A the gas region GR2 on which the imprinting process has been performed and the gas region GR1 to which a gas is currently supplied are separately illustrated, but since both gases are gradually mixed, both regions are unified and illustrated as a gas region GR3 in FIG. 4B.

Figure 5B:
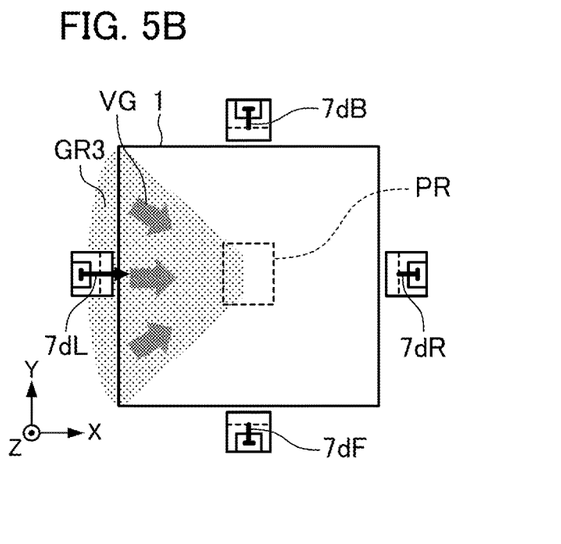

FIG. 5B is a schematic plan view of the XY plane at the same timing as in FIG. 4B. The gas region GR3 moves to the center of the mold 1. Surrounding air flows to a region in which there is no gas.

Figure 4C:
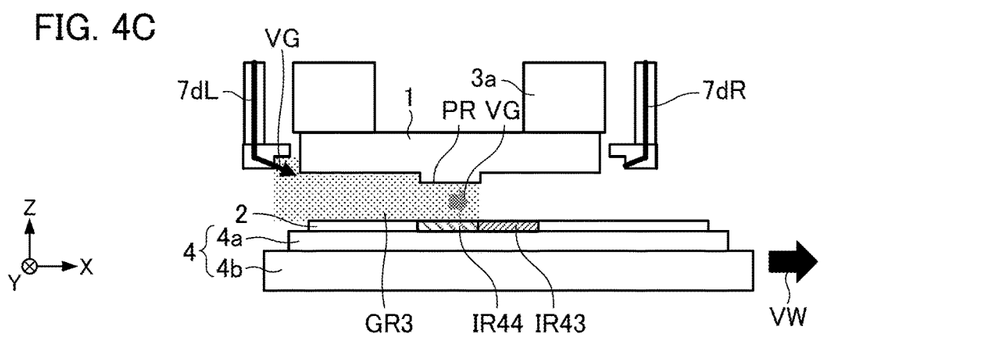

FIG. 4C is a schematic sectional view for Step S102 which is a moving step. The substrate position determining unit 4 moves the substrate 2 to the right side in the drawing such that the imprint region IR44 is located just below the pattern region PR of the mold 1. The moving direction is indicated by an arrow VW.

At this time, with movement of the substrate 2, a Couette flow is generated between the mold 1 and the substrate 2 and the gas region GR3 moves at an average speed which is about half a moving speed of the substrate 2. That is, the gas moves by a distance which is half a moving distance of the substrate 2. The moving direction of the gas is indicated by an arrow VG. The gas region GR3 moves to the pattern region PR. In FIG. 4A, the reason the gas is supplied from the gas supply path 7dL located close to the imprint region IR44 is that the gas is easily supplied to the pattern region PR in consideration of movement of the gas in this step.

Figure 5C:
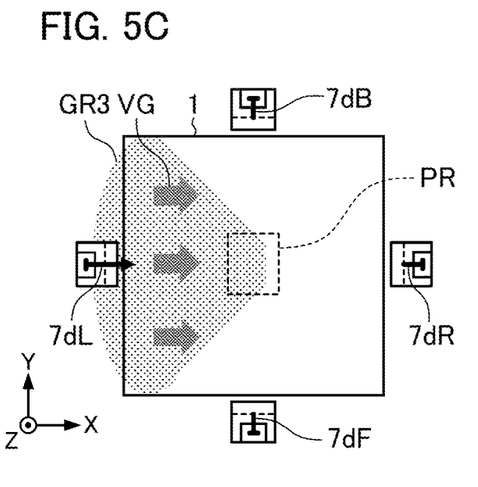

FIG. 5C is a schematic plan view of the XY plane at the same timing as in FIG. 4C. With movement of the substrate 2, the gas region GR3 moves in the moving direction of the substrate 2 as a whole. The moving direction of the gas is indicated by an arrow VG.

Figure 4D:
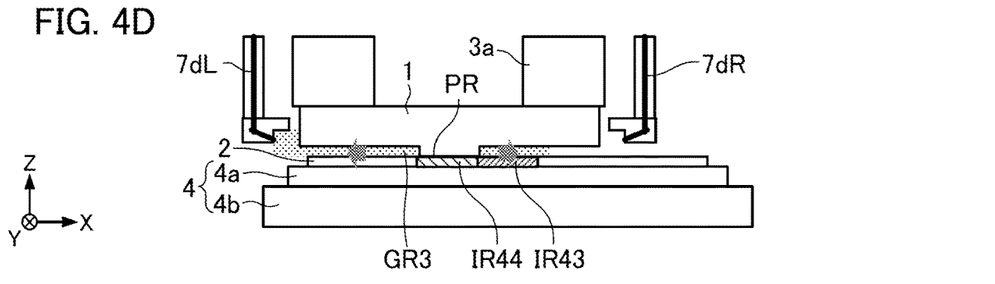

FIG. 4D is a schematic sectional view for Step S103 which is a mold impressing step on the imprint region IR44. In this step, the space between the mold 1 and the substrate 2 is narrowed. Accordingly, a gas in the space between the mold 1 and the substrate 2 is extruded to the outer circumference of the mold 1. A flow in which a gas just below the pattern region PR diffuses to the whole mold 1 is obtained. At this time, since a gas does not flow to below the mold 1 even when the gas is supplied from the gas supply path, supply of the gas may be stopped.

Figure 5D:
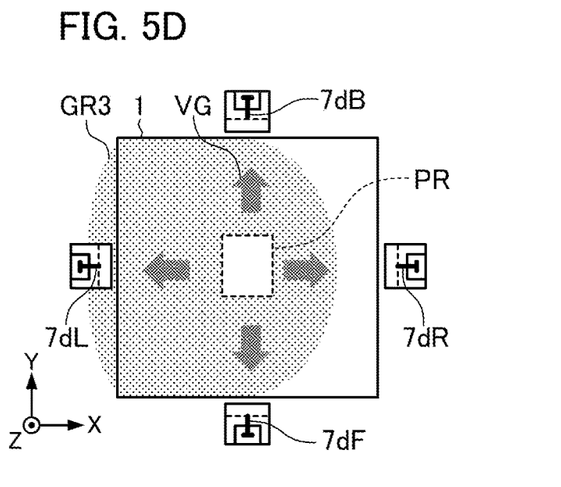

FIG. 5D is a schematic plan view of the XY plane at the same timing as in FIG. 4D. By moving the mold 1 toward the substrate 2, the gas in the gas region GR3 is extruded to the outer circumference from the center of the mold 1.

In this way, a gas can be efficiently supplied to the space between the pattern region PR of the mold 1 and the imprint region of the substrate 2 at the time of impression.

When the moving direction of the substrate 2 in the moving step S102 changes greatly as in the imprint regions IR07, IR08, and IR09, an improvement in gas concentration is performed by supplying an additional gas. This is because there is a likelihood that the gas concentration will be lowered when supply of an additional gas is not performed unlike the present embodiment and the moving direction of the substrate 2 changes greatly.

The case in which the moving direction of the substrate 2 changes greatly is, for example, a case in which the substrate moves in the −X direction (a first direction) from the imprint region IR07 to the imprint region IR08 and moves in the +X direction (a second direction) from the imprint region IR08 to the imprint region IR09. When there is a great change of the moving direction such as inversion of the sign of the moving direction, supply of an additional gas as in the present embodiment causes excellent effects.

A method of supplying an additional gas according to the present embodiment when the moving direction of the substrate 2 changes greatly between imprint regions will be described below with reference to the imprint regions IR07, IR08, and IR09 in FIG. 2.

FIGS. 6A to 6D are schematic views of the XY plane illustrating a relationship between a mold, a substrate, and a distribution of a gas according to the first embodiment when the substrate moves from the imprint region IR07 to the imprint region IR08.

Figure 6A:
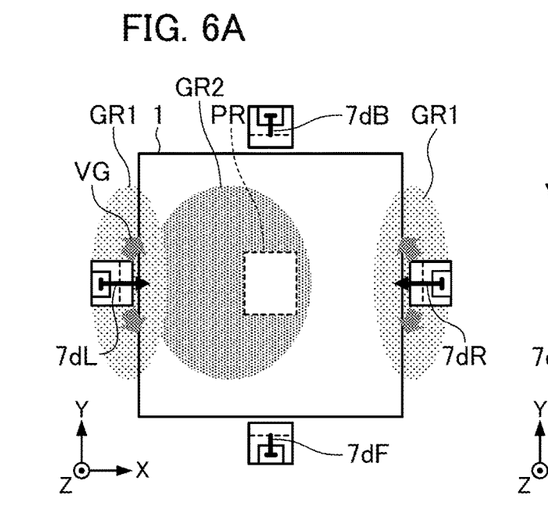
FIGS. 6A to 6D are schematic views of an XY plane illustrating a relationship between a mold, a substrate, and a distribution of a gas according to the first embodiment when movement from an imprint region IR07 to an imprint region IR08 is performed.

FIG. 6A is a schematic plan view of the XY plane in Step S104 which is a filling step on the imprint region IR07. The moving direction (the first direction) from the imprint region IR01 to the imprint region IR07 is the same as the leftward direction in the drawing. However, regarding the imprint region IR08 which is a next imprint region, the moving direction changes temporarily toward the gas supply paths 7dL and 7dB. Then, the moving direction changes to a moving direction from the imprint region IR08 to the imprint region IR09 (the second direction). That is, the moving direction between the imprint regions from the imprint region IR07 to the imprint region IR09 changes in two stages from the first direction to the second direction.

In FIG. 6A, similarly to FIGS. 4A to 4D and FIGS. 5A to 5D, a gas is supplied from the gas supply path 7dL or the gas supply path 7dB. In FIG. 6A, the gas is supplied from the gas supply path 7dL, but the gas may be supplied from the gas supply path 7dL and the gas supply path 7dB at this time. In the present embodiment, FIG. 6A is characterized in that the gas is also supplied from the gas supply path 7dR. This is beforehand supply of a gas for imprinting on the imprint region IR09.

Figure 6B:
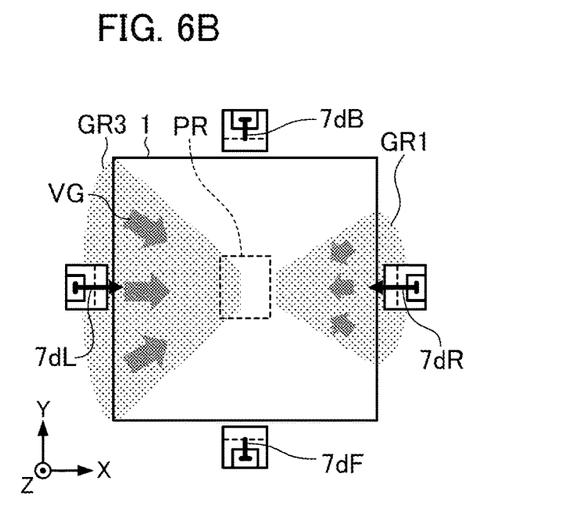

FIG. 6B is a schematic plan view of the XY plane in Step S106 which is the mold releasing step on the imprint region IR07. Since the mold 1 is separated from the substrate 2, the supplied gas flows to the center of the mold 1. Since the gas is also supplied from the gas supply path 7dR, the gas also flows to the space between the center of the mold 1 and the gas supply path 7dR.

Figure 6C:
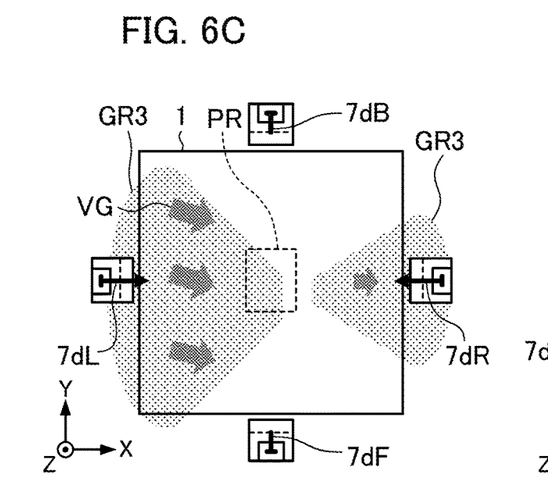

FIG. 6C is a schematic plan view of the XY plane in Step S102 which is the moving step for movement from the imprint region IR07 to the imprint region IR08. At this time, the substrate 2 moves obliquely downward and thus the gas region GR3 moves.

Figure 6D:
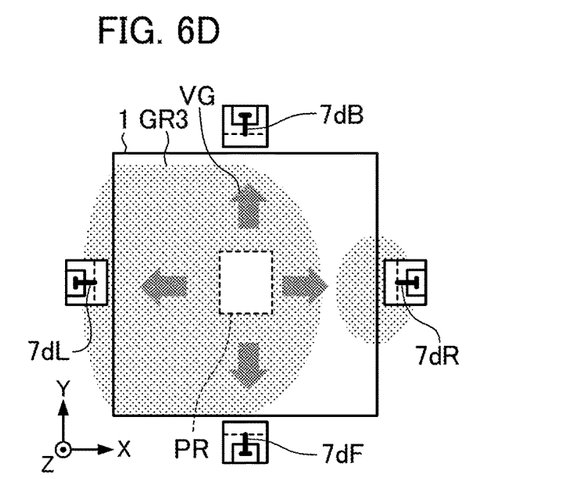

FIG. 6D is a schematic plan view of the XY plane in Step S103 which is the mold impressing step on the imprint region IR08. Since the space between the mold 1 and the substrate 2 is narrowed, the gas between the mold 1 and the substrate 2 is extruded and thus the gas can diffuse from the center of the mold 1 to the outer circumference.

FIGS. 7A to 7D are schematic views of the XY plane illustrating a relationship between a mold, a substrate, and a distribution of a gas according to the first embodiment when the substrate moves from the imprint region IR08 to the imprint region IR09.

Figure 7A:
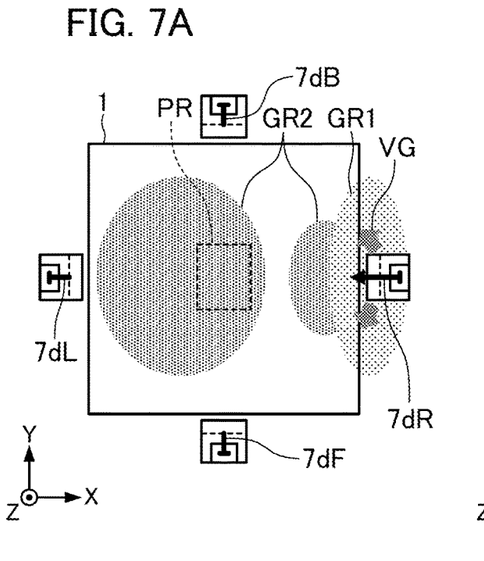
FIGS. 7A to 7D are schematic views of an XY plane illustrating a relationship between a mold, a substrate, and a distribution of a gas according to the first embodiment when movement from the imprint region IR08 to an imprint region IR09 is performed

FIG. 7A is a schematic plan view of the XY plane in Step S104 which is the filling step on the imprint region IR08. The imprint region IR09 which is a next imprint region is located on the right side of the drawing (in the second direction) and is supplied with a gas from the gas supply path 7dR.

The gas region GR2 represents a residual of the gas when the imprinting process has been performed on the imprint region IR08 prior to the imprint region IR09. By supplying a gas from the gas supply path 7dR in the step illustrated in FIG. 6A, the gas region GR2 is present in the space between the center of the mold 1 and the gas supply path 7dR in the step illustrated in FIG. 7A subsequent to FIG. 6D. In FIG. 7A, a gas is additionally supplied from the gas supply path 7dR.

Figure 7B:
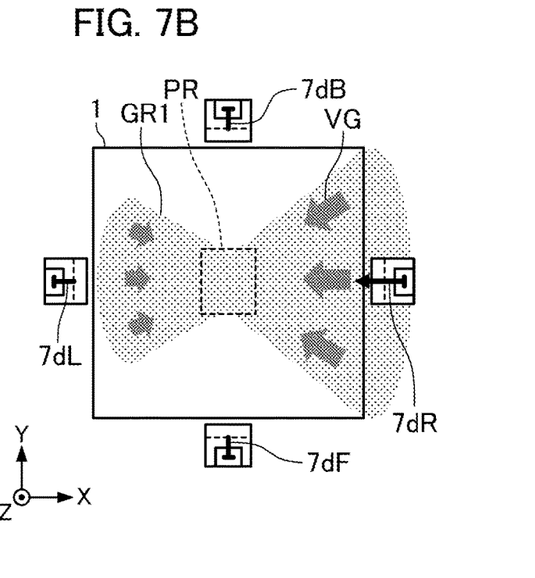

FIG. 7B is a schematic plan view of the XY plane in Step S106 which is the mold releasing step on the imprint region IR08. Since the mold 1 is separated from the substrate 2, the supplied gas flows to the center of the mold 1.

Figure 7C:
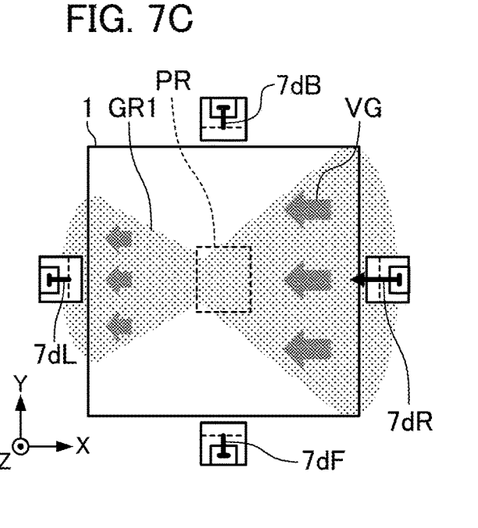

FIG. 7C is a schematic plan view of the XY plane in Step S102 which is the moving step for movement from the imprint region IR08 to the imprint region IR09. At this time, the gas region GR3 moves with movement of the substrate 2.

Figure 7D:
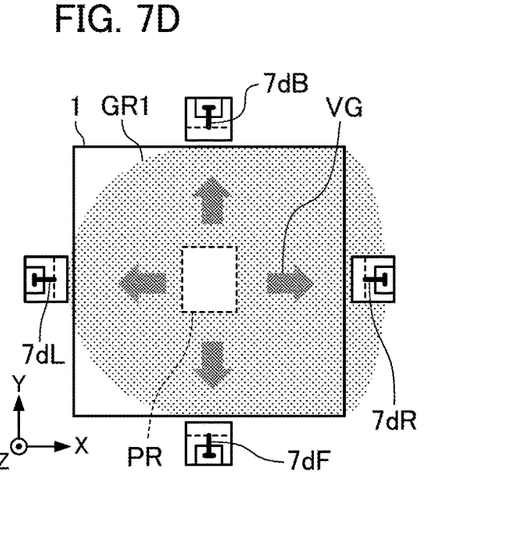

FIG. 7D is a schematic plan view of the XY plane in Step S103 which is the mold impressing step on the imprint region IR09. Since the space between the mold 1 and the substrate 2 is narrowed, the gas between the mold 1 and the substrate 2 can be extruded and the gas can diffuse from the center of the mold 1 to the outer circumference.

As described above with reference to FIGS. 6A to 6D and FIGS. 7A to 7D, in the present embodiment, a gas is supplied from the gas supply path 7dL and/or the gas supply path 7dB and a gas is also supplied from the gas supply path 7dR beforehand in the step illustrated in FIG. 6A. Accordingly, even when the moving direction between the imprint regions changes (is inverted) from the first direction to the second direction, the gas concentration in the space between the pattern region PR of the mold 1 and the substrate 2 can be kept satisfactorily high.

Accordingly, it is possible to reduce an occurrence probability of a defect and to enhance productivity of the imprint device 10. That is, when a gas is not supplied from the gas supply path 7dR in FIG. 6A, the gas region GR2 is not present in the space between the center of the mold 1 and the gas supply path 7dR in FIG. 7A. In this case, even when a gas is supplied from the gas supply path 7dR in the mold releasing step illustrated in FIG. 7B, there is a likelihood that the gas will not reach the center of the mold 1 and thus there is concern of the gas concentration between the pattern region PR of the mold 1 and the substrate 2 being lowered. However, according to the present embodiment, it is possible to stably maintain the gas concentration.

Figure 8:
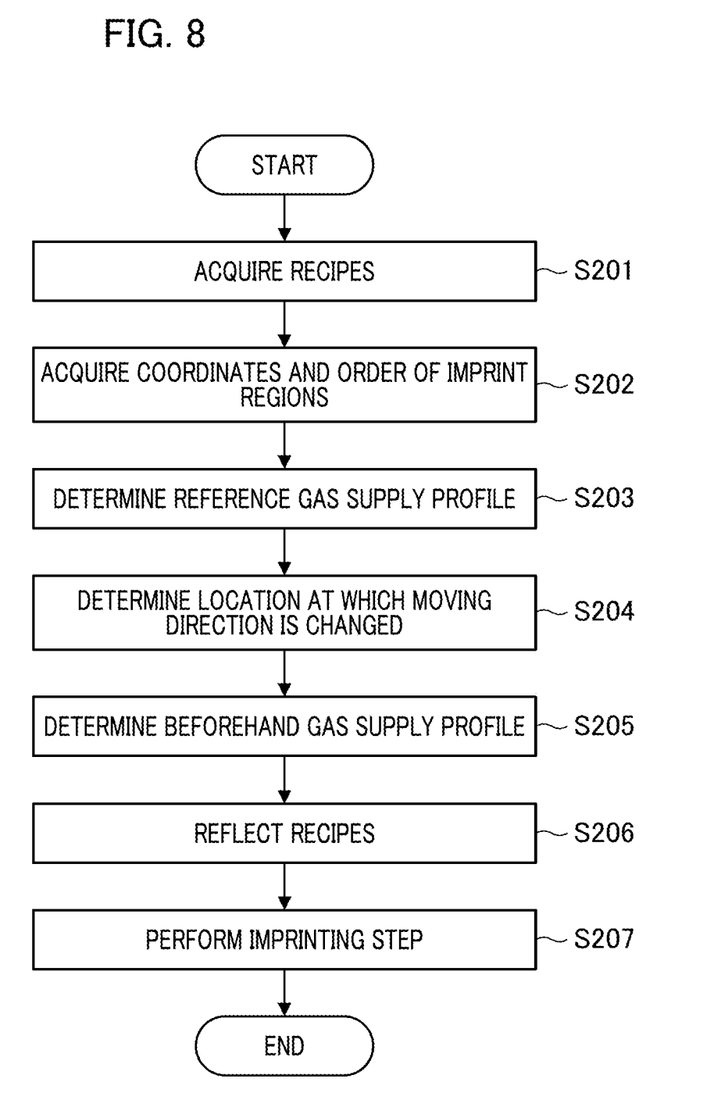
FIG. 8 is a flowchart illustrating a gas supply control method which is performed by a control unit 8 according to the first embodiment.

The aforementioned supply of a gas is controlled by the control unit 8. FIG. 8 is a flowchart illustrating a gas supply control method which is performed by the control unit 8 according to the first embodiment and illustrates a process flow until the control unit 8 acquires imprint conditions and performs an imprinting operation. The process flow illustrated in FIG. 8 is performed by causing the control unit 8 to execute a computer program stored in a memory which is not illustrated.

In Step S201, the control unit 8 acquires imprint conditions (recipes). The imprint conditions include all conditions associated with imprinting and include, for example, a size of the pattern region PR and an amount of curing energy applied by the irradiation unit 6. The imprint conditions also include an amount of supplied gas. The imprint conditions are input by an operator of the imprint device 10 or are acquired from result values (histories) stored in a memory.

In Step S202, the control unit 8 acquires position information and imprinting order information of the imprint regions on the substrate from the imprint conditions.

In Step S203, the control unit 8 determines a gas supply profile (a gas supplying operation from the gas supply unit) serving as a reference. The gas supply profile includes amounts of gas supplied to the gas supply paths and gas supply timings. The reference gas supply profile can be determined on the basis of the position information and the imprinting order information of the imprint regions on the substrate acquired in Step S202.

As described above with reference to FIGS. 4A to 4D and FIGS. 5A to 5D, a gas is also supplied from the gas supply path in the progress direction after direction inversion has been performed in a filling step previous two stages to the direction inversion. Regarding an amount of supplied gas, a necessary amount of gas changes depending on a gap d between the mold 1 and the substrate 2, a quality of the surface of the substrate 2, and the like. Accordingly, the amount of supplied gas may be automatically determined on the basis of the result values (histories) or may be selected by an operator.

In Step S204, the control unit 8 determines whether the moving direction between the imprint regions changes. Change of the imprinting direction can be determined, for example, with reference to whether the sign of the moving direction is inverted in the X and Y directions on the basis of the information acquired in Step S202.

In Step S205, a beforehand gas supply profile is determined on the basis of the result of determination of Step S204. When the moving direction between the imprint regions changes, the beforehand gas supply profile is set such that a gas is additionally supplied as described above with reference to FIGS. 6A to 6D and FIGS. 7A to 7D. The beforehand gas supply profile is a gas supply profile in which the imprint region prior two stages to the inversion of the moving direction is also supplied with a gas from the gas supply path in the progress direction after the direction inversion beforehand.

That is, when the moving direction between the imprint regions changes from the first direction to the second direction, the imprint space in the first direction and the second direction is supplied with a gas from the gas supply unit with the imprinting operation on the imprint region before the inversion of the moving direction. Here, the imprinting operation includes a mold impressing operation of impressing the mold on the imprint material (an operation of pressing the mold to the imprint material) and a mold releasing operation (an operation of separating the mold from the imprint material).

In the present embodiment, the imprint space in the first direction and the second direction is supplied with a gas from the gas supply unit at the timing illustrated in FIG. 6A. However, the imprint space in the first direction and the second direction may be supplied with a gas from the gas supply unit at the timing illustrated in FIG. 6B.

The present invention is not limited to selecting one or two gas supply paths for supplying a gas with the imprinting operation, but a gas may be supplied from three or more gas supply paths.

In this case, as in the present embodiment, the gas supply profile is preferably set to supply a relatively large amount of gas from a gas supply path in the progress direction. In the imprint region prior two stages to the inversion of the imprint regions, a sufficient amount of gas is also preferably supplied from the gas supply path in the progress direction after the direction inversion. That is, the gas supply profile in the present embodiment includes, for example, switching a balance between the amounts of gas supplied form three or more gas supply paths according to change of the direction of the imprint regions.

When the moving direction between the imprint regions does not change from the first direction, the imprint space in the second direction is not supplied with a gas from the gas supply unit with the imprinting operation on the imprint region before the moving direction has changed. Alternatively, an amount of gas supplied to the imprint space in the second direction may be reduced greatly.

In Step S206, the control unit 8 reflects the reference gas supply profile and the beforehand gas supply profile determined in Steps S203 and S205 in the imprint conditions and performs the gas supply step as illustrated in FIGS. 4A to 7D.

In Step 207, the control unit 8 performs a imprinting step. The imprinting step is a step of performing the imprinting process illustrated in FIG. 3.

In this way, the imprint device 10 determines the gas supply profile and performs imprinting on the basis of the position information of the imprint regions and the imprinting order information. By automatically determining the gas supply profile, it is possible to shorten the time required for setting and to improve productivity.

Second Embodiment

An imprint device 10 according to a second embodiment of the present invention will be described below. Details not mentioned in the second embodiment are the same as in the first embodiment. In the first embodiment, an additional gas supply profile is determined on the basis of the position information and the imprinting order of the imprint regions. In the second embodiment, the imprinting order is determined from the position information of the imprint regions, and the additional gas supply profile is not necessary.

As described above in the first embodiment, when the moving direction between the imprint regions is inverted, there is concern of a gas concentration being lowered. Therefore, the second embodiment is characterized in that the imprinting order is determined such that the moving direction between the imprint regions is not inverted.

Figure 9:
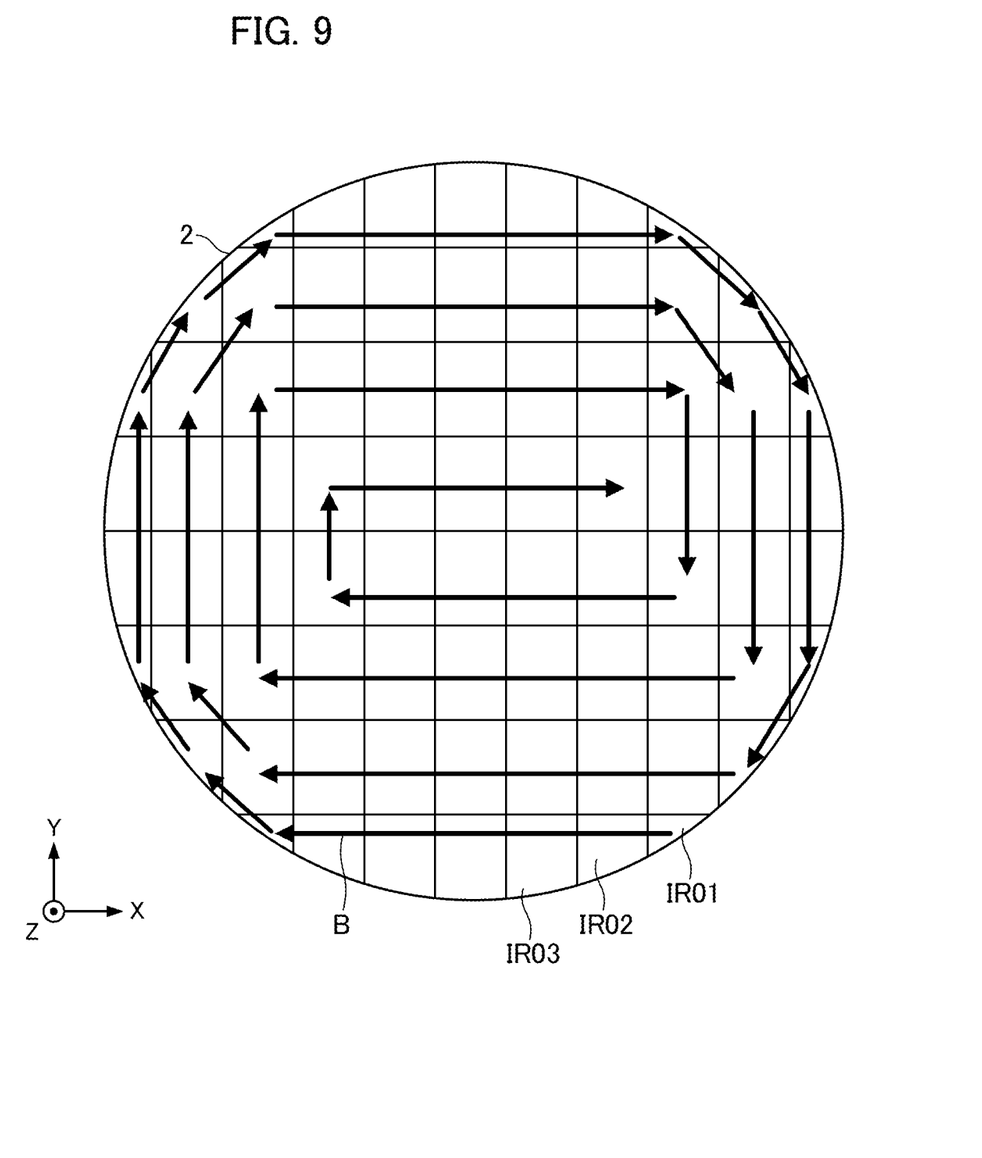
FIG. 9 is a diagram illustrating an example of imprint regions and the imprinting order of a substrate 2 according to a second embodiment.

FIG. 9 is a diagram illustrating an example of imprint regions and the imprinting order of a substrate 2 according to the second embodiment. Regions into which a circular substrate 2 is divided in a lattice shape are imprint regions. The order of performing the imprinting process is indicated by an arrow B. In this way, the imprinting order is set in a spiral shape such that the moving direction is not inverted. In the second embodiment, the imprinting order is determined by the control unit 8. Accordingly, the imprinting order illustrated in FIG. 9 is determined by the control unit 8.

Figure 10:
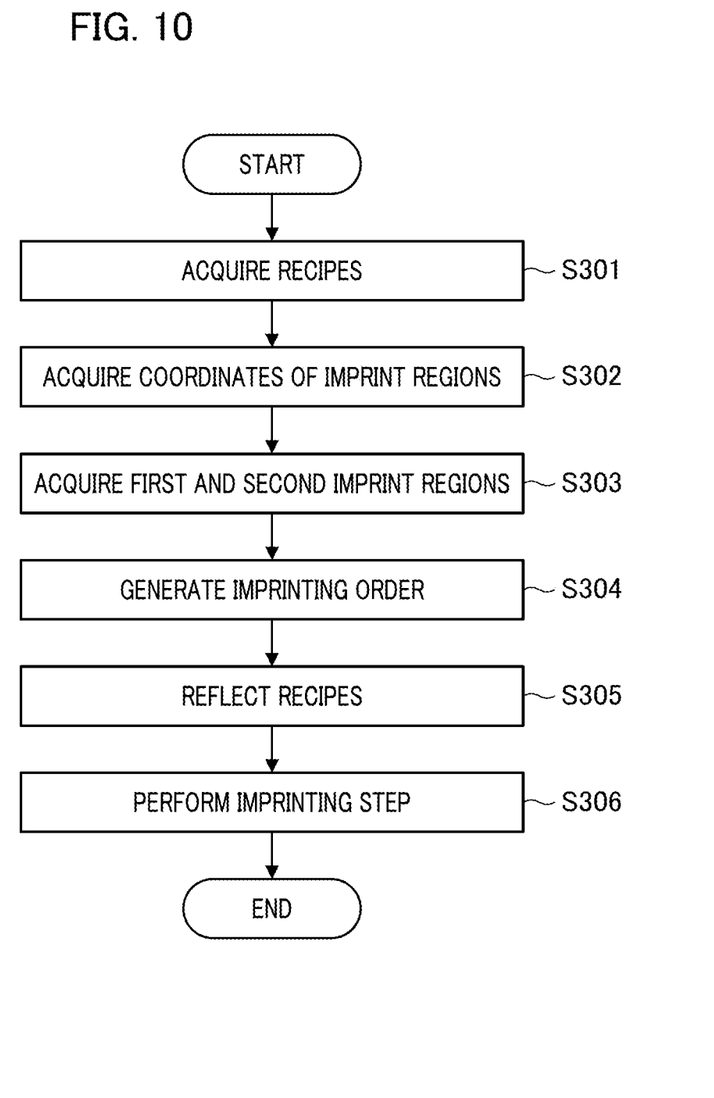
FIG. 10 is a flowchart illustrating an operation flow which is performed by an imprint device 10 according to the second embodiment.

FIG. 10 is a flowchart illustrating the imprinting process which is performed by the imprint device 10 according to the second embodiment. FIG. 10 illustrates a process of acquiring imprint conditions (recipes) and performing an imprinting step, which is performed by the control unit 8. The process flow illustrated in FIG. 10 is performed by causing the control unit 8 to execute a computer program stored in a memory which is not illustrated.

In Step S301, the control unit 8 acquires imprint conditions (recipes).

In Step S302, the control unit 8 acquires position information (coordinates) of a plurality of imprint regions on the substrate out of the imprint conditions.

In Step S303, the control unit 8 acquires a first imprint region on which imprinting is first performed and a second imprint region on which imprinting is next performed. The first imprint region and the second imprint region may be input, for example, by an operator or may be normally automatically determined to be the right-lowest imprint region of the substrate 2, or the like.

In Step S304, the control unit 8 generates the imprinting order on the basis of the position information of the plurality of imprint regions on the substrate acquired in Step S302 and the information acquired in Step S303. The imprinting order can be generated such that an amount of change of the moving direction decreases sequentially from a third imprint region on which imprinting is performed next to the second imprint region. That is, the imprinting order is determined such that the amount of change of the moving direction between the imprint regions of the substrate is equal to or less than 90 degrees (a determination step). For example, an imprint region closest to a wafer edge is selected out of non-imprinted regions adjacent to a target imprint region. This determination method is used in the example illustrated in FIG. 9.

In Step S305, the control unit 8 reflects the imprinting order generated in Step S304 in the imprint conditions.

In Step S306, the control unit 8 performs an imprinting step. The imprinting step is a step of performing the imprinting process illustrated in FIG. 3.

In this way, the imprint device 10 determines the imprinting order and performs imprinting on the basis of the position information of the imprint regions. By performing imprinting such that the moving direction between the imprint regions is not inverted in this way, it is possible to reduce the likelihood that a gas concentration will be lowered. Accordingly, it is possible to reduce an occurrence probability of a defect and to improve productivity of the imprint device 10.

Third Embodiment

Embodiment Associated with Article Manufacturing Method

An article manufacturing method according to an embodiment of the present invention can be suitably used to manufacture a micro device such as a semiconductor device or an article such as an element having a micro structure. The article manufacturing method according to the present embodiment includes a step of forming a pattern on an imprint material applied on a substrate using the imprint device (an imprinting step of imprinting the substrate) and a processing step of processing the substrate on which the pattern has been formed in the imprinting step. The processing step includes other known steps (such as oxidation, film formation, deposition, doping, planarization, etching, resist separation, dicing, bonding, and packaging). The article manufacturing method according to the present embodiment is advantageous in at least one of performance, quality, productivity, and production cost of an article in comparison with a method according to the related art.

A pattern of a cured material shaped using the imprint device 10 is permanently used as at least a part of various articles or is temporarily used to manufacture various articles. Examples of the article include an electrical circuit element, an optical element, an MEMS, a recording element, a sensor, and a mold. Examples of the electrical circuit element include a volatile or nonvolatile semiconductor memory such as a DRAM, an SRAM, a flash memory, or an MRAM or a semiconductor element such as an LSI, a CCD, an image sensor, and an FPGA. An example of the mold is an imprinting mold.

The pattern of a cured material is used as a constituent of at least a part of the article or is temporarily used as a resist mask. The resist mask is removed after etching, ion implantation, or the like has been performed in the processing step of a substrate.

Other Embodiments

While the present invention has been described with reference to exemplary embodiments, it is to be understood that the invention is not limited to the disclosed exemplary embodiments. The scope of the following claims is to be accorded the broadest interpretation to encompass all such modifications and equivalent structures and functions. In addition, as a part or the whole of the control according to this embodiment, a computer program realizing the function of the embodiment described above may be supplied to the imprint device through a network or various storage media. Then, a computer (or a CPU, an MPU, or the like) of the imprint device may be configured to read and execute the program. In such a case, the program and the storage medium storing the program configure the present invention.

This application claims the benefit of Japanese Patent Application No. 2021-095416 filed on Jun. 7, 2021, which is hereby incorporated by reference herein in its entirety.

What is claimed is:

1. An imprint device comprising:
a mold holding unit configured to hold a mold;
a mold driver configured to move the mold holding unit;
a substrate holding unit configured to hold a substrate;
a substrate driver configured to move the substrate holding unit;
a gas supply unit configured to supply a gas to an imprint space between the mold and the substrate;
and at least one processor or circuit configured to function as:
a control unit configured to control a supply of a gas from the gas supply unit and to cause an imprinting operation to be performed by causing the mold driver to move the mold holding unit holding the mold and by causing the substrate driver to move the substrate holding unit holding the substrate to thereby bring the mold and an imprint material disposed on the substrate into contact with each other,
wherein the control unit is configured to cause the imprinting operation to be sequentially performed on a plurality of imprint regions of the substrate by causing the substrate driver to move the substrate holding unit holding the substrate, and
wherein the control unit is configured to, when a moving direction of the substrate is to be changed from a first direction to a second direction in order to move the substrate from a first imprint region to a second imprint region among the plurality of imprint regions, cause the gas supply unit to supply the gas to the imprint space from both of the first direction and the second direction i) while the imprinting operation is performed on the first imprint region and (ii) while the moving direction of the substrate is changed from the first direction to the second direction.

2. The imprint device according to claim 1, wherein the control unit is configured to determine a gas supply operation of the gas supply unit on a basis of position information and imprinting order information of the plurality of imprint regions on the substrate.

3. The imprint device according to claim 1, wherein the imprinting operation includes a mold impressing operation of impressing the mold onto the imprint material on the substrate and a mold releasing operation.

4. The imprint device according to claim 1, wherein the control unit is configured not to cause the gas supply unit to supply a gas to the imprint space in the second direction during the imprinting operation on a third imprint region in a case where the moving direction of the substrate between the third imprint region and a fourth imprint region is not to be changed from the first direction.

* * * * *